(12) United States Patent
Moon

(10) Patent No.: US 9,842,950 B2
(45) Date of Patent: Dec. 12, 2017

(54) SOLAR CELL MODULE APPARATUS AND METHOD OF FABRICATING THE SAME

(71) Applicant: LG INNOTEK CO., LTD., Seoul (KR)

(72) Inventor: Bong Seok Moon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 624 days.

(21) Appl. No.: 14/352,810

(22) PCT Filed: Oct. 17, 2012

(86) PCT No.: PCT/KR2012/008499
§ 371 (c)(1),
(2) Date: Apr. 18, 2014

(87) PCT Pub. No.: WO2013/058553
PCT Pub. Date: Apr. 25, 2013

(65) Prior Publication Data
US 2014/0246091 A1    Sep. 4, 2014

(30) Foreign Application Priority Data
Oct. 18, 2011  (KR) .................. 10-2011-0106374

(51) Int. Cl.
| H01L 31/0232 | (2014.01) |
| G02B 5/09 | (2006.01) |
| H01L 31/048 | (2014.01) |
| H01L 31/054 | (2014.01) |

(52) U.S. Cl.
CPC ...... H01L 31/02327 (2013.01); H01L 31/048 (2013.01); H01L 31/0547 (2014.12); *Y02E 10/52* (2013.01)

(58) Field of Classification Search
None
See application file for complete search history.

(56) References Cited

U.S. PATENT DOCUMENTS

| 5,554,229 A * | 9/1996 | Vogeli ............... H01L 31/02242 |
| | | 136/256 |
| 7,807,920 B2 * | 10/2010 | Linke .................. H01L 31/048 |
| | | 136/246 |
| 2003/0015234 A1 * | 1/2003 | Yasuno ................ H01L 31/068 |
| | | 136/249 |

(Continued)

FOREIGN PATENT DOCUMENTS

| CN | 201222505 Y | 4/2009 |
| KR | 10-2011-0040372 A | 4/2011 |

OTHER PUBLICATIONS

International Search Report in International Application No. PCT/KR2012/008499, filed Oct. 17, 2012.

(Continued)

*Primary Examiner* — Magali P Slawshi
(74) *Attorney, Agent, or Firm* — Saliwanchik, Lloyd & Eisenschenk

(57) ABSTRACT

Disclosed are a solar cell module apparatus and a method of fabricating the same. The solar cell module apparatus includes a light absorbing layer, and a reflector provided on a light incident surface of the light absorbing layer to reflect a light, which has been reflected from the light absorbing layer, toward the light absorbing layer.

11 Claims, 1 Drawing Sheet

(56) References Cited

U.S. PATENT DOCUMENTS

| | | | |
|---|---|---|---|
| 2005/0001101 A1* | 1/2005 | Maurel | B64G 1/503 |
| | | | 244/171.7 |
| 2008/0041434 A1* | 2/2008 | Adriani | B23K 31/02 |
| | | | 136/244 |
| 2008/0223436 A1* | 9/2008 | den Boer | H01L 31/02246 |
| | | | 136/256 |
| 2009/0056789 A1* | 3/2009 | Draganov | H01L 31/18 |
| | | | 136/246 |
| 2010/0126567 A1 | 5/2010 | Kaufman | |
| 2011/0140106 A1 | 6/2011 | Forbes | |
| 2011/0186119 A1 | 8/2011 | Atwater et al. | |
| 2012/0227796 A1* | 9/2012 | Dougherty | H01L 31/0543 |
| | | | 136/255 |
| 2012/0273025 A1* | 11/2012 | Tomlinson | F24J 2/067 |
| | | | 136/246 |
| 2013/0087200 A1* | 4/2013 | Xue | H01L 31/02327 |
| | | | 136/259 |

OTHER PUBLICATIONS

Office Action dated May 11, 2016 in Chinese Application No. 201280062740.7.

\* cited by examiner

[Fig. 1]
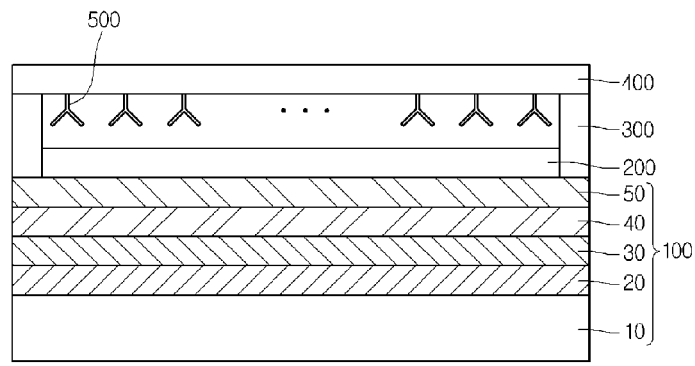
[Fig. 2]
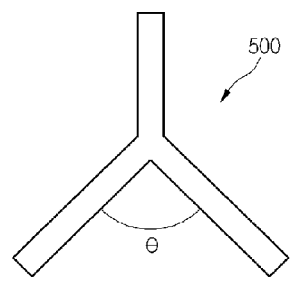
[Fig. 3]
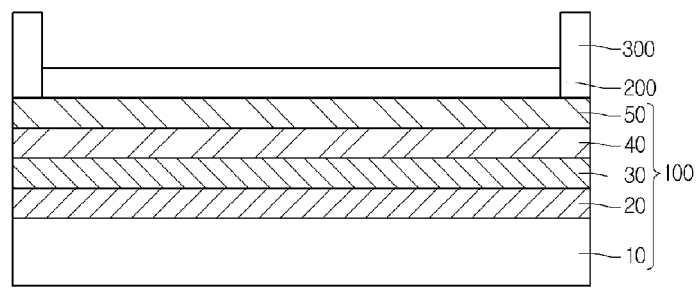
[Fig. 4]
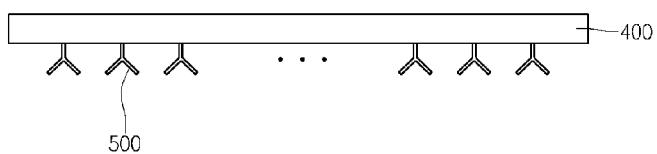
[Fig. 5]
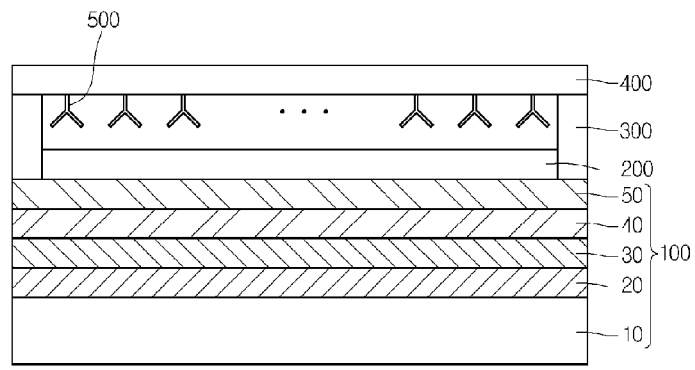

SOLAR CELL MODULE APPARATUS AND METHOD OF FABRICATING THE SAME

CROSS-REFERENCE TO RELATED APPLICATIONS

This application is the U.S. national stage application of International Patent Application No. PCT/KR2012/008499, filed Oct. 17, 2012, which claims priority to Korean Application No. 10-2011-0106374, filed Oct. 18, 2011, the disclosures of each of which are incorporated herein by reference in their entirety.

TECHNICAL FIELD

The embodiment relates to a solar cell module apparatus and a method of fabricating the same.

BACKGROUND ART

Recently, as energy consumption is increased, a solar cell has been developed to convert solar energy into electrical energy.

In particular, a CIGS-based solar cell, which is a P-N hetero junction apparatus having a substrate structure including a glass substrate, a metallic back electrode layer, a P type CIGS-based light absorbing layer, a high resistance buffer layer, and an N type window layer, has been extensively used.

In addition, in order to increase the efficiency of the solar cell, various studies have been performed.

According to the above solar cell of the related art, since the solar cell is installed in the form of a plane, when the solar light is irradiated into the solar cell at a right angle, light collecting efficiency of the solar cell is increased. In contrast, when the solar light is irradiated into the lateral side of the solar cell, the light collecting efficiency of the solar cell is rapidly reduced. In addition, when the solar light is irradiated into the lateral side of the solar cell, the solar light is reflected from the solar cell installed in the form of the plane, so that the solar light cannot be effectively utilized. Since the solar cell is a technology having the infinite possibility of development as future fuel, the solar cell must be urgently developed.

DISCLOSURE OF INVENTION

Technical Problem

The embodiment provides a solar cell module apparatus having improved photo-electric conversion efficiency and a method of fabricating the same.

Solution To Problem

According to the embodiment, there is provided a solar cell module apparatus including a light absorbing layer, and a reflector provided on a light incident surface of the light absorbing layer to reflect a light, which has been reflected from the light absorbing layer, toward the light absorbing layer.

Advantageous Effects Of Invention

As described above, according to the embodiment, the light reflected from the solar cell panel is trapped and then re-reflected to the solar cell panel, thereby improving photoelectric conversion efficiency.

BRIEF DESCRIPTION OF DRAWINGS

FIG. 1 is a sectional view showing a solar cell module apparatus according to the embodiment of the disclosure;

FIG. 2 is a sectional view showing a reflector according to the embodiment of the disclosure; and FIGS. 3 to 5 are sectional views showing the processes of fabricating the solar cell module apparatus according to the embodiment of the disclosure.

BEST MODE FOR CARRYING OUT THE INVENTION

In the description of the embodiments, it will be understood that, when a substrate, a film, a layer, or an electrode is referred to as being on or under another substrate, layer, film, or electrode, it can be directly or indirectly on the other substrate, film, layer, or electrode, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

FIG. 1 is a sectional view showing a solar cell module apparatus according to the embodiment. Referring to FIG. 1, a solar cell panel 100 includes a substrate 10, a back electrode layer 20, a light absorbing layer 30, a buffer layer 40, and a window layer 50. The panel 100 may be provided thereon with a protective layer 200. A reflector 500 may be bonded to a cover glass 400, and the protective layer 200 may be spaced apart from the cover glass 400 by a supporter 300.

The substrate 10 has a plate shape and supports the back electrode layer 20, the light absorbing layer 30, the buffer layer 40, and the window layer 50.

The substrate 10 may include an insulator. The substrate 10 may include a glass substrate, a plastic substrate such as a polymer substrate, or a metallic substrate. In addition, the substrate 10 may include a ceramic substrate including alumina, stainless steel, or polymer having flexibility. The substrate 10 may be transparent or may be rigid or flexible.

If the substrate 10 includes a soda lime glass substrate, sodium (Na) contained in the soda lime glass may be diffused into the light absorbing layer 30 including CIGS during the process of fabricating the solar cell. Accordingly, the concentration of charges of the light absorbing layer 30 may be increased, thereby increasing the photo-electric conversion efficiency of the solar cell.

The back electrode layer 20 is provided on the substrate 10. The back electrode layer 20 is a conductive layer. The back electrode layer 20 transfers charges produced in the light absorbing layer 30 of the solar cell, thereby allowing current to flow to the outside of the solar cell. The back electrode layer 20 must represent higher electric conductivity and lower resistivity in order to perform the above function.

In addition, the back electrode layer 20 must maintain high-temperature stability when heat treatment is performed under the atmosphere of sulfur (S) or selenium (Se) required when a CIGS compound is formed. In addition, the back electrode layer 20 must represent a superior adhesive property with respect to the substrate 10 such that the back electrode layer 20 is prevented from being delaminated from the substrate 10 due to the difference in the thermal expansion coefficient between the back electrode layer 20 and the substrate 10.

The back electrode layer 20 may include any one of molybdenum (Mo), gold (Au), aluminum (Al), chrome (Cr), tungsten (W), and copper (Cu). Among them, Mo makes the lower difference in the thermal expansion coefficient from the substrate 10 when comparing with the other elements, so that the Mo represents a superior adhesive property, thereby preventing the above de-lamination phenomenon, and totally satisfying the characteristic required for the back electrode layer 20.

The back electrode layer 20 may include at least two layers. In this case, the layers may include the same metal or different metals.

The light absorbing layer 30 may be formed on the back electrode layer 20. The light absorbing layer 30 includes a P type semiconductor compound. In more detail, the light absorbing layer 30 includes a group I-III-VI-based compound. For example, the light absorbing layer 30 may have a $Cu(In,Ga)Se_2$ (CIGS) crystal structure, a $Cu(In)Se_2$ crystal structure, or a $Cu(Ga)Se2$ crystal structure. The light absorbing layer 300 has an energy bandgap in the range of about 1.1 eV to about 1.2 eV.

The buffer layer 40 is provided on the light absorbing layer 30. According to the solar cell having the light absorbing layer 30 including the CIGS compound, a P-N junction is formed between a CIGS compound thin film, which serves as a P type semiconductor, and the window layer 50 which is an N type semiconductor. However, since two materials represent the great difference in the lattice constant and the bandgap energy therebetween, a buffer layer having the intermediate bandgap between the bandgaps of the two materials is required to form the superior junction between the two materials.

The energy bandgap of the buffer layer 40 may be in the range of 2.2 eV to 2.5 eV. The buffer layer 40 includes CdS or ZnS, and the CdS is more generally used.

The buffer layer 40 may have the thickness of 10 nm to 100 nm.

A high resistance buffer layer (not shown) may be provided on the buffer layer 40. The high resistance buffer layer includes zinc oxide (i-ZnO) which is not doped with impurities. The energy bandgap of the high resistance buffer layer is in the range of about 3.1 eV to about 3.3 eV.

The window layer 50 is provided on the buffer layer 40. The window layer 50 is transparent and includes a conductive layer. In addition, the resistance of the window layer 50 is higher than that of the back electrode layer 20.

The window layer 50 includes oxide. For example, the window layer 50 may include zinc oxide, indium tin oxide (ITO), or indium zinc oxide (IZO).

In addition, the window layer 50 may include Al doped zinc oxide (AZO) or Ga doped zinc oxide (GZO).

The protective layer 200 is formed on the solar panel 100 to protect the solar panel 100 from being oxidized due to the external environments. For example, the protective layer 200 may include an ethylene vinyl acetate copolymer (EVA).

The reflector 500 may be formed on the protective layer 200. The reflector 500 may have the shape gradually widened toward the protective layer 200 from the cover glass 400. For example, the section of the reflector 500 may have the shape of an inverse Y.

The section of the reflector 500 may have the shape of an inverse Y in which each line segment is formed through combination of rectangular surfaces, or may have a conical shape. If the reflector 500 is formed by coupling three rectangular surfaces with each other, the rectangular surfaces may be formed with the lengths corresponding to the cover glass 400, or discretely formed, but the embodiment is not limited thereto.

The light incident into a light incident surface of the panel 100 and reflected from the panel 100 is re-reflected to the panel 100 by the reflector 500, so that the photoelectric conversion efficiency can be improved.

If the angle of a branch region, at which the section of the reflector 500 branches in the shape of an inverse Y, is excessively small, the quantity of the light, which is reflected from the panel 100 and re-reflected from the reflector 500 toward the panel 100, is reduced, so that the re-reflection effect is slightly represented. If the angle is excessively increased, the quantity of the solar light incident into the panel 100 may be reduced by the reflector 500. In this regard, the angle may be in the range of 10 to 90. Preferably, the angle may be in the range of 30 to 40.

The reflector 400 may include a material representing the reflectance of 50% or more. For example, although the reflector 400 may include aluminum (Al), the embodiment is not limited thereto.

The reflector 500 may be bonded to the cover glass 400 by a transparent tape, and then may be bonded to the protective layer 200.

The protective layer 200 may be spaced apart from the cover glass 400 by the supporter 300 formed at the lateral side of the panel 100.

FIGS. 3 to 5 are sectional views showing the method of fabricating the solar cell according to the embodiment. The description of the present fabricating method will be made by making reference to the above description of the solar cell. The above description of the solar cell may be incorporated in the description of the present fabricating method.

Referring to FIG. 3, the back electrode layer 20 is formed on the substrate 10. The back electrode layer 20 may be formed by depositing Mo. The back electrode layer 20 may be formed through a physical vapor deposition (PVD) scheme or a plating scheme. In addition, an additional layer such as an anti-diffusion layer may be interposed between the substrate 10 and the back electrode layer 20.

Then, the light absorbing layer 30 is formed on the back electrode layer 20. The light absorbing layer 30 is formed by extensively using schemes, such as a scheme of forming a $Cu(In,Ga)Se_2$(CIGS) based-light absorbing layer by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 20 through a sputtering process employing a Cu target, an In target, or a Ga target.

Thereafter, the metallic precursor layer is subject to the selenization process so that the $Cu(In,Ga)Se_2$(CIGS) based-light absorbing layer 30 is formed.

In addition, the sputtering process employing the Cu target, the In target, and the Ga target and the selenization process may be simultaneously performed.

In addition, a CIS or a CIG light absorbing layer 30 may be formed through a sputtering process employing only Cu and In targets or only Cu and Ga targets and the selenization process.

Thereafter, the buffer layer 40 is formed on the light absorbing layer 30. The buffer layer 40 may be formed through a PVD scheme or a plating scheme. The window layer 50 is formed by depositing a transparent conductive material on the buffer layer 40, thereby forming the solar cell panel 100.

Subsequently, the protective layer 200 may be formed on the panel 100. The protective layer 200 may be formed by using an EVA sheet. In order to fabricate the EVA sheet, after various additives are mixed with EVA, which is polyethylene-based resin, the mixture is introduced into an extruder. Thereafter, the result is melted by applying the heat to the result and extrusion-molded in the form of a sheet, so that the EVA sheet may be fabricated.

The protective layer 200 may be formed with the width narrower than that of the panel 100, and the supporter 300 may be formed at the upper edge of the panel 100. The supporter 300 may be formed higher than the protective layer 200.

Referring to FIG. 4, the reflector 500 may adhere to the cover glass 400 through a transparent tape. The reflector 500 may include a material representing at least 50% of reflectance. The reflector 500 may include a metallic material, for example, aluminum (Al). The reflector 500 may have an inverse Y sectional shape. The reflector 500 may be formed by coupling three rectangular metallic plates, or may have a conical shape. The reflector 500 has a shape having a width gradually widened toward the panel, and branches at a predetermined region thereof. The angle of the branch region is in the range of 10 to 90, preferably, in the range of 30 to 40.

Thereafter, as shown in FIG. 5, the cover glass 400 having the reflector 500 is coupled with the panel 100 including the supporter 300, thereby fabricating the solar cell module apparatus.

According to the embodiment, the light reflected from the solar cell panel is trapped and re-reflected to the solar cell panel, thereby improving the photoelectric conversion efficiency.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module apparatus comprising:
a solar cell panel including a substrate, a back electrode layer, a light absorbing layer, a buffer layer, and a window layer;
a protective layer formed on a top surface of the solar cell panel;
a support layer formed on an outer peripheral region of the top surface of the solar cell panel;
a cover glass formed on the support layer and making contact with the support layer; and
a reflector formed on the cover glass and provided on a light incident surface of the solar cell panel to reflect light, the light being reflected from the solar cell panel, toward the solar cell panel;
wherein the back electrode layer, the light absorbing layer, the buffer layer, and the window layer are sequentially formed on the substrate,
wherein the protective layer is formed with a width smaller than that of the solar cell panel,
wherein the protective layer directly makes contact with a top surface of the window layer of the solar cell panel,
wherein the support layer directly makes contact with the top surface of the window layer and a lateral surface of the protective layer,
wherein the support layer is formed with a height greater than that of the protective layer or that of the reflector,
wherein the reflector is disposed between the protective layer and the cover glass,
wherein the reflector directly makes contact with the cover glass and is spaced apart from the protective layer, and
wherein the protective layer is spaced apart from the cover glass by the support layer.

2. The solar cell module apparatus of claim 1, wherein the protective layer includes an EVA sheet.

3. The solar cell module apparatus of claim 1, wherein the reflector has a shape with an opening gradually expanded toward the light absorbing layer.

4. The solar cell module apparatus of claim 3, wherein the reflector has a section of an inverse Y shape.

5. The solar cell module apparatus of claim 1, wherein the reflector includes a metallic material.

6. The solar cell module apparatus of claim 5, wherein the reflector includes aluminum (Al).

7. The solar cell module apparatus of claim 4, wherein the section of the reflector having the inverse Y shape includes two protrusions at an angle θ, the angle θ being in a range of 10° to 90°.

8. The solar cell module apparatus of claim 1, wherein the reflector is formed on the protective layer.

9. The solar cell module apparatus of claim 1, wherein the reflector has a shape gradually widened toward the protective layer from the cover glass.

10. The solar cell module apparatus of claim 3, wherein the reflector has a conical shape.

11. The solar cell module apparatus of claim 1, wherein the reflector includes a material having reflectance of 50% or more.

* * * * *